United States Patent
Kataoka et al.

(10) Patent No.: US 9,419,649 B1
(45) Date of Patent: Aug. 16, 2016

(54) ENCODING METHOD AND ENCODING DEVICE

(71) Applicant: FUJITSU LIMITED, Kawasaki-shi, Kanagawa (JP)

(72) Inventors: Masahiro Kataoka, Kamakura (JP); Toshihiro Nishimura, Hachioji (JP); Yasuhiro Suzuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/010,735

(22) Filed: Jan. 29, 2016

(30) Foreign Application Priority Data

Jan. 30, 2015 (JP) ................................. 2015-017852

(51) Int. Cl.
*G06F 17/21* (2006.01)
*G06Q 10/10* (2012.01)
*H03M 7/30* (2006.01)

(52) U.S. Cl.
CPC ................. *H03M 7/70* (2013.01); *G06F 17/21* (2013.01); *G06Q 10/107* (2013.01)

(58) Field of Classification Search
None
See application file for complete search history.

(56) References Cited

U.S. PATENT DOCUMENTS

| 7,206,995 | B2 | 4/2007 | Fujisaki et al. |
| 2013/0091426 | A1* | 4/2013 | Hashida ................ G06F 3/0237 715/261 |
| 2015/0278201 | A1* | 10/2015 | Prokofyev .......... G06F 17/2872 704/2 |

FOREIGN PATENT DOCUMENTS

| JP | 7-244669 | | 9/1995 |
| JP | 11-143864 | | 5/1999 |
| JP | 2003-50795 | | 2/2003 |
| JP | 3628160 | | 3/2005 |
| JP | 2010073086 | A * | 4/2010 |

* cited by examiner

*Primary Examiner* — Howard Williams
(74) *Attorney, Agent, or Firm* — Oblon, McClelland, Maier & Neustadt, L.L.P.

(57) ABSTRACT

An encoding device searches input text data for a date-time notation string that represents at least a date or time. The encoding device generates, upon finding the date-time notation string by the search unit, a converted date and time code including an identification code for identifying the date-time notation string and a normalized date and time notation formed by converting the date-time notation string into a specific date-time notation format. The encoding device converts the input text data based on conversion information that associates the converted date-time code generated by the generation unit with the date-time notation string.

7 Claims, 14 Drawing Sheets

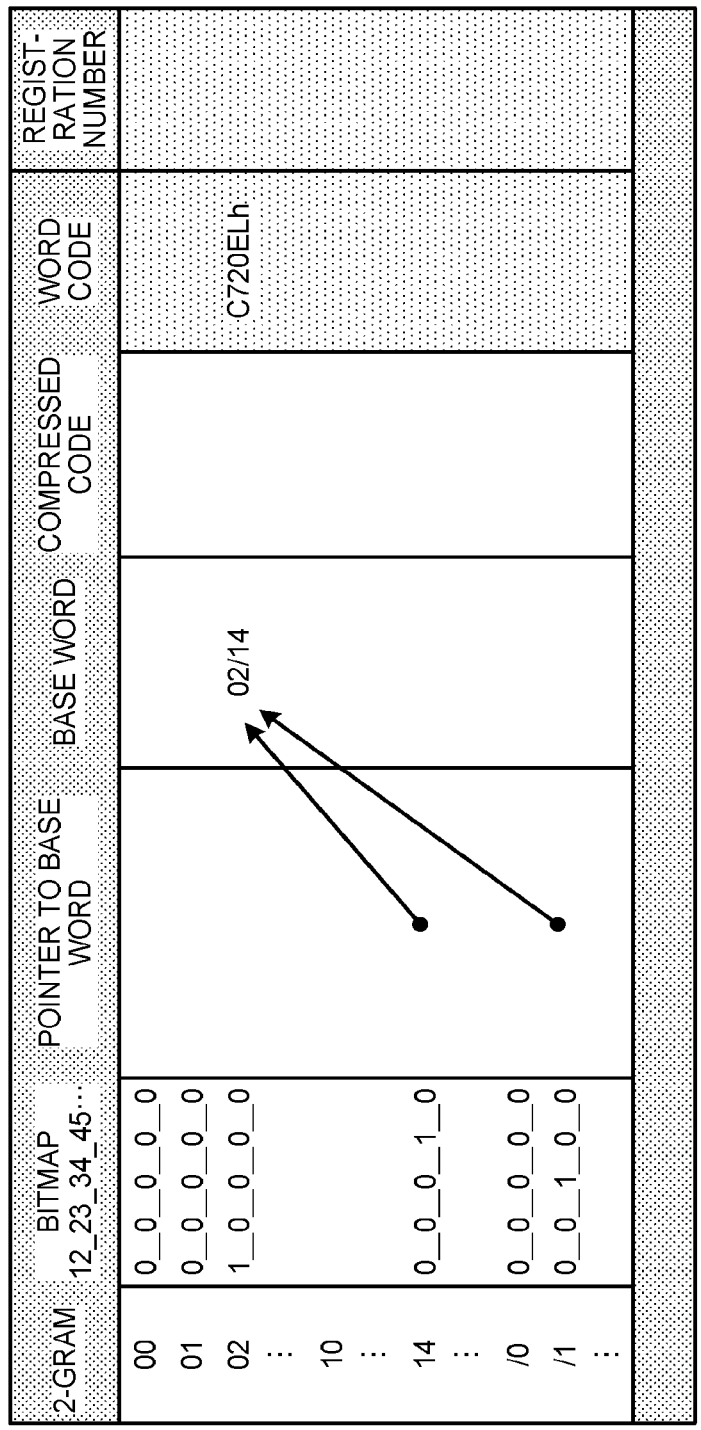

FIG.5A

- CONFIGURATION

3 BYTES (C0000*h TO C7FFFF*h)

| 1100 | 0 | | | | **** |
|------|---|---|---|---|------|

FIXED | YEAR 0 TO 9999(12,287) (FOUR DIGITS) | NOTATION PATTERN 0 TO 7

POSITIVE OR NEGATIVE (0:AC/1:BC)

- DETAILS OF NOTATION PATTERNS

| NUMBER | PATTERN | EXAMPLE | REMARKS |
|--------|---------|---------|---------|
| 0 | ONE-BYTE, WITHOUT COMMA | 2013 | |
| 1 | ONE-BYTE, WITH COMMA | 13 | |
| 2 | TWO-BYTE, WITHOUT COMMA | 2013 | |
| 3 | TWO-BYTE, WITH COMMA | 13 | |
| 4 | JAPANESE, ONE-BYTE | YEAR OF 2013 NOTATION IN JAPANESE | |
| 5 | JAPANESE, TWO-BYTE | YEAR OF 2013 (TWO-BYTE NUMERALS) NOTATION IN JAPANESE | |
| 6 | JAPANESE, TWO-BYTE, NOTATION IN KANJI | 2013 (NOTATION IN KANJI) NOTATION IN JAPANESE | |
| 7 | BLANK | | |

FIG.5B

- CONFIGURATION

3 BYTES (C7000*h TO C7FFFF*h)

| 1100 | 0111 | **** | 000* | **** | **** |
|------|------|------|------|------|------|

FIXED | MONTH JAN TO DEC (16) | DAY 1 TO 31(32) | NOTATION PATTERN 0 TO F

- DETAILS OF NOTATION PATTERNS

| NUMBER | PATTERN | EXAMPLE | REMARKS |
|--------|---------|---------|---------|
| 0 | ONE-BYTE, WITH COMMA | Apr.1st | |
| 1 | ONE-BYTE, WITH SLASH | 4/1 | |
| 2 | TWO-BYTE, WITH COMMA | Apr. 1st | |
| 3 | TWO-BYTE, WITH SLASH | 4/1 | |
| 4 | JAPANESE, ONE-BYTE | 1ST DAY OF 4TH MONTH NOTATION IN JAPANESE | |
| 5 | JAPANESE, TWO-BYTE | 1ST DAY OF 4TH MONTH (TWO-BYTE NUMERALS) NOTATION IN JAPANESE | |
| 6 | JAPANESE, TWO-BYTE, NOTATION IN KANJI | 1ST DAY OF 4TH MONTH (NOTATION IN KANJI) NOTATION IN JAPANESE | |
| 7 | BLANK | | |

| REGISTRATION NUMBER | COMPRESSED CODE | CODE |
|---|---|---|
| ⋮ | ⋮ | ⋮ |
| 3 | A003h | A001A7h |
| 4 | A004h | C8F001h |
| 5 | A005h | CA1101C720E1 |
| ⋮ | ⋮ | ⋮ |

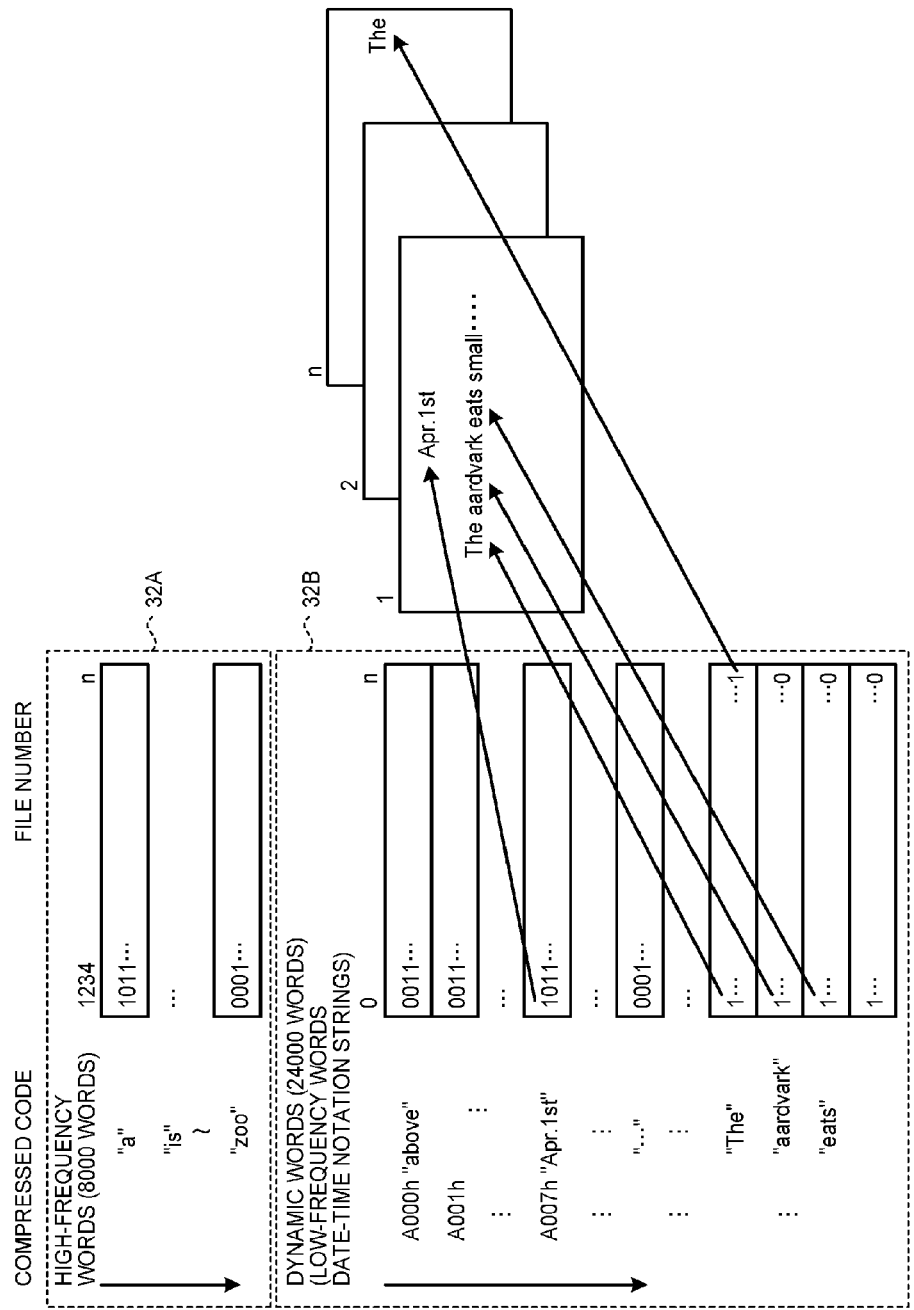

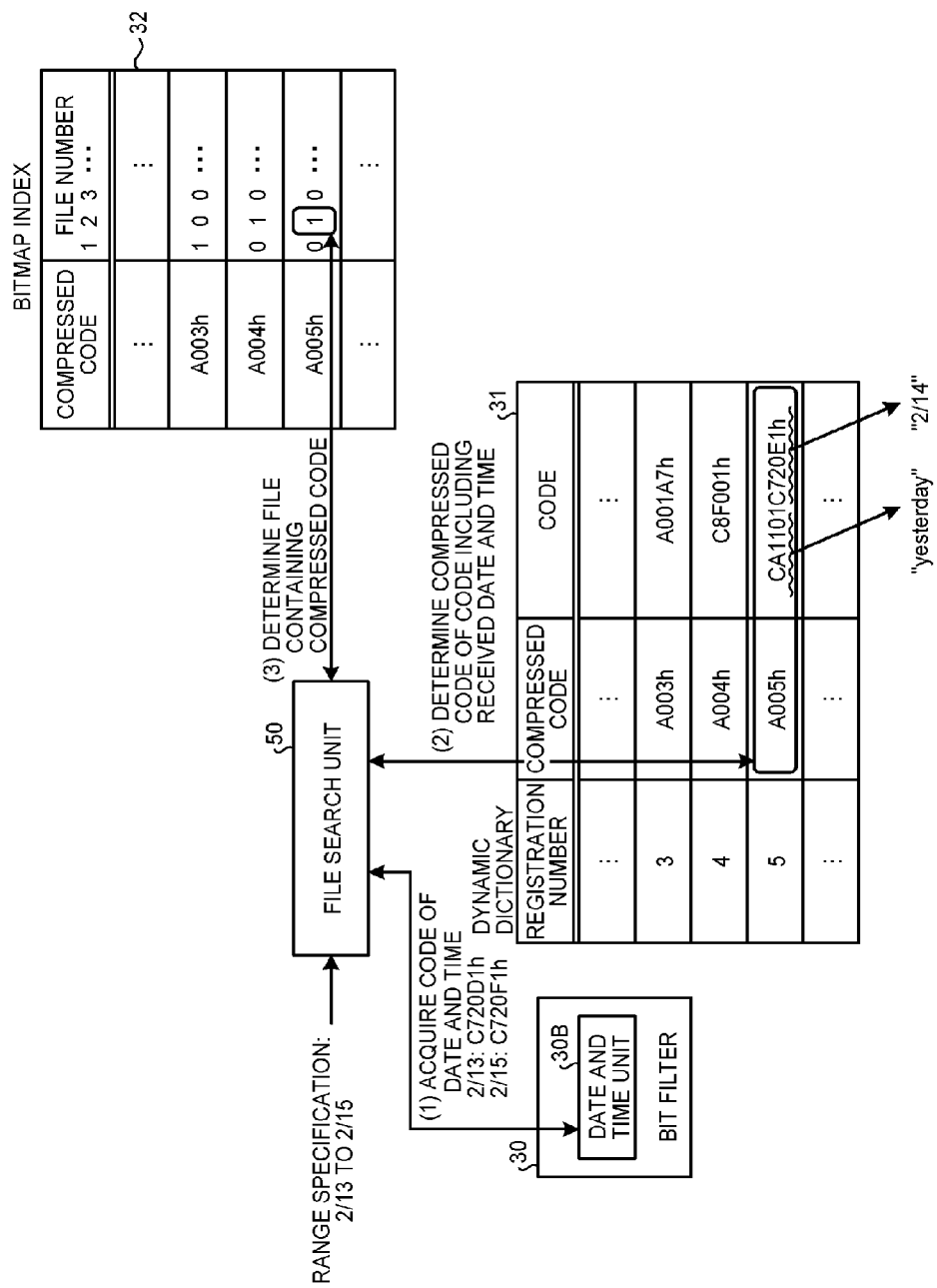

ENCODING METHOD AND ENCODING DEVICE

CROSS-REFERENCE TO RELATED APPLICATIONS

This application is based upon and claims the benefit of priority of the prior Japanese Patent Application No. 2015-017852, filed on Jan. 30, 2015, the entire contents of which are incorporated herein by reference.

FIELD

The embodiment discussed herein is directed to a computer-readable recording medium, an encoding method, and an encoding device.

BACKGROUND

Date and time are represented in various notation formats. For example, date and time are represented by relative date and time notation that represents a specific date and time relative to a reference date and time, and by absolute date and time notation that represents a specific date and time in an absolute sense. Time is represented by the 24-hour time notation that represents a time of day in the 24-hour clock, and by the 12-hour time notation in which a day is divided into the morning and the afternoon and a time of day is represented in the 12-hour clock. In some cases, date and time are represented by using specific words for representing date and time, kanji (a Japanese writing system), and numerals.

In this condition, for example, when a user searches a text file for a specific date and time, search is performed by using date-time notation strings (date and/or time notation strings) in several different notation formats corresponding to the date and time that the user wants to find. For example, when the user searches for 15:00, search is performed by using "15:00", and also "three o'clock in the afternoon" and "3:00 pm".

Conventional technologies are known in which, when a user searches document data for a date-time notation string representing a specific date and time, and when a found date-time notation string is represented by relative date and time notation, a date-time notation string represented by absolute date and time notation is written, on the document data, next to the date-time notation string represented by relative date and time notation. Such a conventional technology is described in Japanese Laid-open Patent Publication No. 2003-050795, for example.

In document search, however, such a technology is expected not to make any change on the original document, and is also expected to present a text that has been found to the user, and thus, writing a date-time notation string represented by absolute date and time notation next to a date-time notation string represented by relative date and time notation is undesirable.

SUMMARY

According to an aspect of an embodiment, a non-transitory computer-readable recording medium stores a encoding program that causes a computer to execute a process. The process includes searching input text data for a date-time notation string that represents at least a date or time; generating, upon finding the date-time notation string, a converted date and time code including an identification code for identifying the date-time notation string and a normalized date-time notation formed by converting the date-time notation string into a specific date-time notation format; and converting the input text data based on conversion information that associates the converted date-time code with the date-time notation string.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4B is a diagram illustrating an example of a date and time unit in the bit filter;

FIG. 5A is a diagram illustrating an example of a coding system of year notation patterns;

FIG. 5B is a diagram illustrating an example of a coding system of month and day notation patterns;

FIG. 8 is a diagram illustrating an example of a data configuration of a bitmap index;

FIG. 9 is a schematic diagram illustrating the procedure of date and time search by way of range specification;

DESCRIPTION OF EMBODIMENTS

Preferred embodiments of the present invention will be explained with reference to accompanying drawings. The embodiments are not intended to limit the scope of the present invention. The embodiments may be combined as appropriate to the extent to which the processes are consistent with each other.

[a] First Embodiment

Compression Processing

Figure 1:
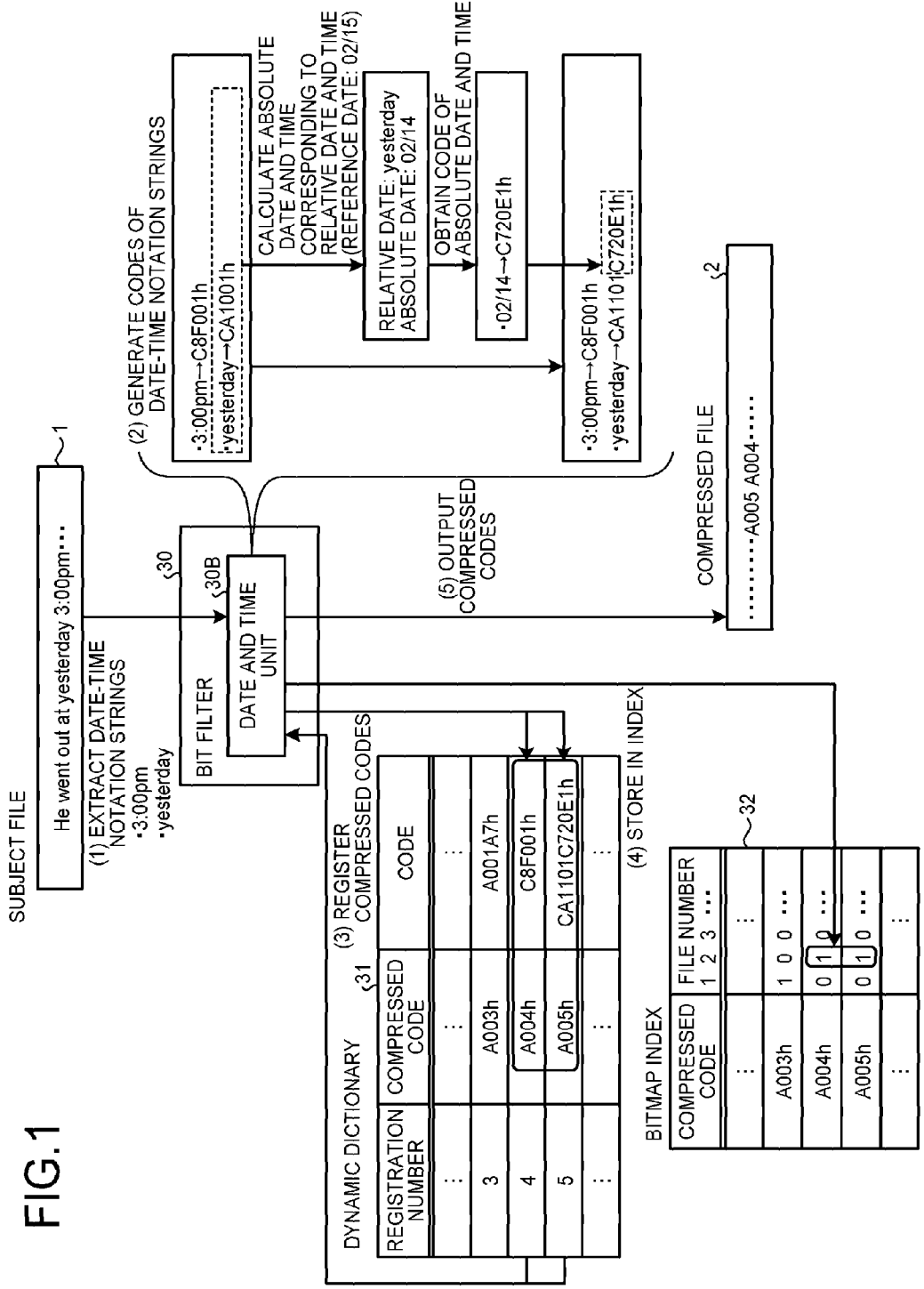
FIG. 1 is a schematic diagram illustrating the procedure for compressing date-time notation strings.

Described first is an outline of compression processing of date-time notation strings performed by an encoding device 10 according to a first embodiment with reference to FIG. 1. FIG. 1 is a schematic diagram illustrating the procedure for compressing date-time notation strings. FIG. 1 illustrates an example in which the encoding device 10 compresses a phrase "He went out at yesterday 3:00 pm" contained in a subject file 1 that is a subject of the compression processing. The encoding device 10 searches the subject file 1 for date-time notation strings that represent date and time. Date and time are represented in a plurality of notation formats. The encoding device 10 searches for, for example, symbols, numerals, words, and characters used in representing date and time in the various notation formats, and determines the notation format of the preceding and the following strings of a found part, thereby finding the date-time notation strings. Examples of the symbols used in representing date and time include "1" as a divider in date representations and ":" as a divider in time representations. Examples of the words used in representing date and time include "yesterday", "tomorrow", "ago", "am", and "pm". In FIG. 1, for example, the encoding device 10 searches for "pm" and "yesterday" to find date-time notation strings such as "yesterday" and "3:00 pm".

The encoding device 10 extracts a found date-time notation string, and collates it with a date and time unit 30B in a bit filter 30. In FIG. 1, for example, the encoding device 10 extracts the date-time notation strings "yesterday" and "3:00 pm" and collates them with the date and time unit 30B in the bit filter 30. The date and time unit 30B in the bit filter 30 stores conversion information that associates a date-time notation string with a word code and a compressed code. Word codes corresponding to various date-time notation strings are registered in advance in the date and time unit 30B in the bit filter 30. For example, a word code "CA1001h" corresponding to "yesterday", and a word code "C8F001h" corresponding to "3:00 pm" are registered in the date and time unit 30B in the bit filter 30. The "h" at the rightmost position of each word code indicates that the code is represented in hexadecimal notation. The word codes registered in advance in association with the respective date-time notation strings each have a code in chronological order in a normalized date and time notation that is formed by converting a date-time notation string into a certain date and time notation format, and contain an identification code for identifying the notation format of the date-time notation string. Details of the word codes will be described later. Details of the data configuration of the date and time unit 30B in the bit filter 30 will also be described later.

The encoding device 10 acquires a word code corresponding to a date-time notation string by collating the string with the date and time unit 30B in the bit filter 30, and generates a code for the date-time notation string. In FIG. 1, for example, the encoding device 10 acquires the word code "CA1001h" corresponding to "yesterday", and the word code "C8F001h" corresponding to "3:00 pm". Examples of the date and time notation include relative date and time notation that represents a specific date and time relative to a reference date and time, and absolute date and time notation that represents a specific date and time in an absolute sense. When a date-time notation string is represented by relative date and time notation, the encoding device 10 calculates an absolute date and time of the date-time notation string on the basis of a certain reference date and time. The reference date and time is, for example, the date and time at which the subject file 1 was created. The reference date and time is determined in the following manner. When, for example, the subject file 1 contains date and time information such as date and time created or updated, the encoding device 10 uses the date and time contained in the date and time information as the reference date and time. When, for example, the subject file 1 is an email and contains transmission date and time of a mail, the encoding device 10 uses the transmission date and time of the mail as the reference date and time. The encoding device 10 may use the current date and time of its own as the reference date and time. The encoding device 10 may dynamically change the subject of the reference date and time. For example, if the subject file 1 contains the date and time information, the encoding device 10 may use the date and time information as the reference date and time, and if not, the encoding device 10 may use the current date and time of its own as the reference date and time. In FIG. 1, for example, the reference date and time is "02/15", and thus the encoding device 10 calculates "02/14" as the absolute date and time of "yesterday", which is a relative date and time notation.

The encoding device 10 obtains a code of the absolute date and time by referring to the date and time unit 30B in the bit filter 30 and acquiring a word code corresponding to the calculated absolute date and time. In FIG. 1, for example, the encoding device 10 acquires a word code "C720E1h" corresponding to "02/14".

The encoding device 10 generates a code that represents the date-time notation string. When the date-time notation string is represented by absolute date and time notation, the encoding device 10 uses the acquired word code as the code of the date-time notation string. When the date-time notation string is represented by relative date and time notation, the encoding device 10 adds a code of an absolute date and time to the acquired word code of the date-time notation string represented by relative date and time notation to generate a code. In FIG. 1, for example, the encoding device 10 generates a code "C8F001h" for "3:00 pm", and generates a code "CA1101C720E1h" for "yesterday". The code "CA1001h" of "yesterday" is changed to "CA1101h" because of a continuation flag that indicates addition of a code of an absolute date and time. Details of the continuation flag will be described later.

The encoding device 10 allocates a new compressed code to the generated code, associates the generated code with the compressed code, and registers them in a dynamic dictionary 31. In FIG. 1, for example, the code "C8F001h" is associated with a compressed code "A004h", and the code "CA1101C720E1h" is associated with a compressed code "A005h", and the codes are registered in the dynamic dictionary 31. The encoding device 10 also registers the new compressed code in the bit filter 30 as a compressed code corresponding to the collated word. The encoding device 10 outputs the allocated, new compressed code to a compressed file 2. Next time the encoding device 10 finds a string having a compressed code registered in the bit filter 30, the encoding device 10 outputs the registered compressed code to the compressed file 2 to compress the subject file 1. For example, next time the string "3:00 pm" appears in the subject file 1, the encoding device 10 acquires the compressed code "A004h", which is already registered in the bit filter 30, and outputs the compressed code to the compressed file 2.

The encoding device 10 records, in a bitmap index 32, presence of the collated word in the subject file 1. In the bitmap index 32, a unique file number is assigned to each file. When a string corresponding to a certain compressed code appears in a file of a certain file number, the encoding device 10 records "1" in the bitmap index 32, and when the string corresponding to the compressed code does not appear in the file, the encoding device 10 records "0" therein. In FIG. 1, for example, the file number of the subject file 1 is "2", and the bitmap index 32 contains "1"s for the compressed codes "A004h" and "A005h" in the column of file number "2".

As for the remaining part of the subject file 1 other than the date-time notation strings, the encoding device 10 divides the remaining part word by word, and acquires the respective words. The encoding device 10 then converts the words into compressed codes by using a word unit 30A in the bit filter 30 to be described later, and outputs them to the compressed file 2. In FIG. 1, for example, the words "He", "went", "out", and "at" are compressed by using the word unit 30A in the bit filter 30 to be described later.

Search Processing

Figure 2:
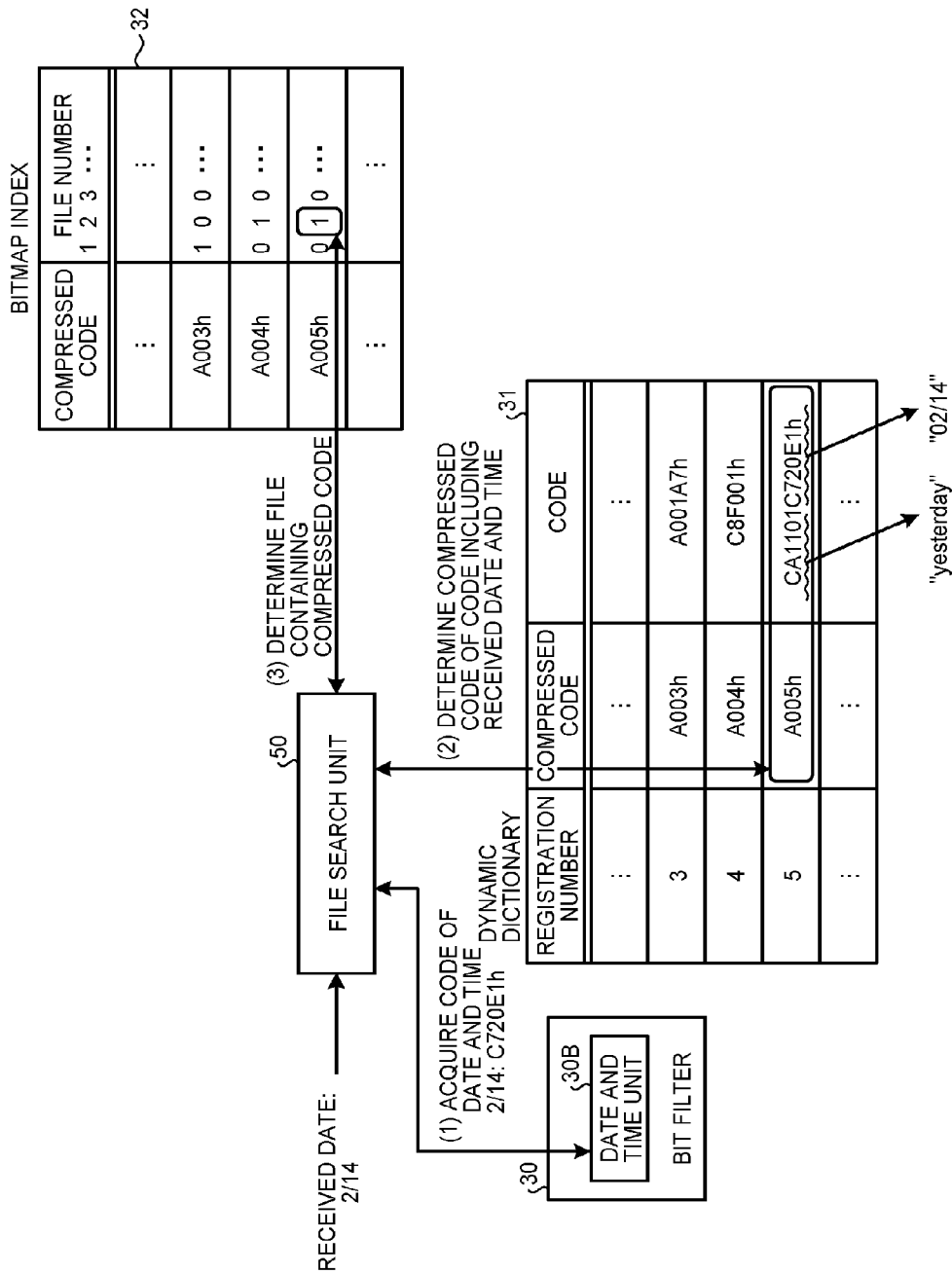
FIG. 2 is a schematic diagram illustrating the procedure of date and time search.

Described next is an outline of search processing for date and time performed by the encoding device 10 according to the first embodiment with reference to FIG. 2. FIG. 2 is a schematic diagram illustrating the procedure of date and time search. In FIG. 2, for example, a file search unit 50 of the encoding device 10 receives an input of date and time that is a search target. In FIG. 2, for example, the file search unit 50 receives an input of "2/14". The file search unit 50 acquires a word code corresponding to the input date from the date and time unit 30B in the bit filter 30. The file search unit 50 acquires the word code by normalizing the notation format of the input date. For example, the file search unit 50 normalizes the notation format "2/14" to "02/14", and acquires the word code. In FIG. 2, for example, the file search unit 50 acquires a word code "C720E1h" corresponding to "2/14". The file search unit 50 refers to the dynamic dictionary 31 to search for a compressed code associated with a code including the word code "C720E1h". In FIG. 2, for example, the code "CA1101C720E1h" associated with the compressed code "A005h" contains the word code "C720E1h". A portion "CA1101" contained in the code "CA1101C720E1h" corresponds to "yesterday" that is a relative date and time notation. A portion "C720E1" contained in the code "CA1101C720E1h" is a code corresponding to "02/14" that is an absolute date and time. In FIG. 2, for example, the file search unit 50 finds the compressed code "A005h". The file search unit 50 refers to the bitmap index 32 to determine the file containing the found compressed code. In FIG. 2, for example, the file search unit 50 determines that the compressed code "A005h" is contained in a file having its index value "2". In other words, when, the encoding device 10 can search a file containing a date and time recorded in a relative date and time notation format by inputting the date and time represented by absolute date and time notation.

Device Configuration

Figure 3:
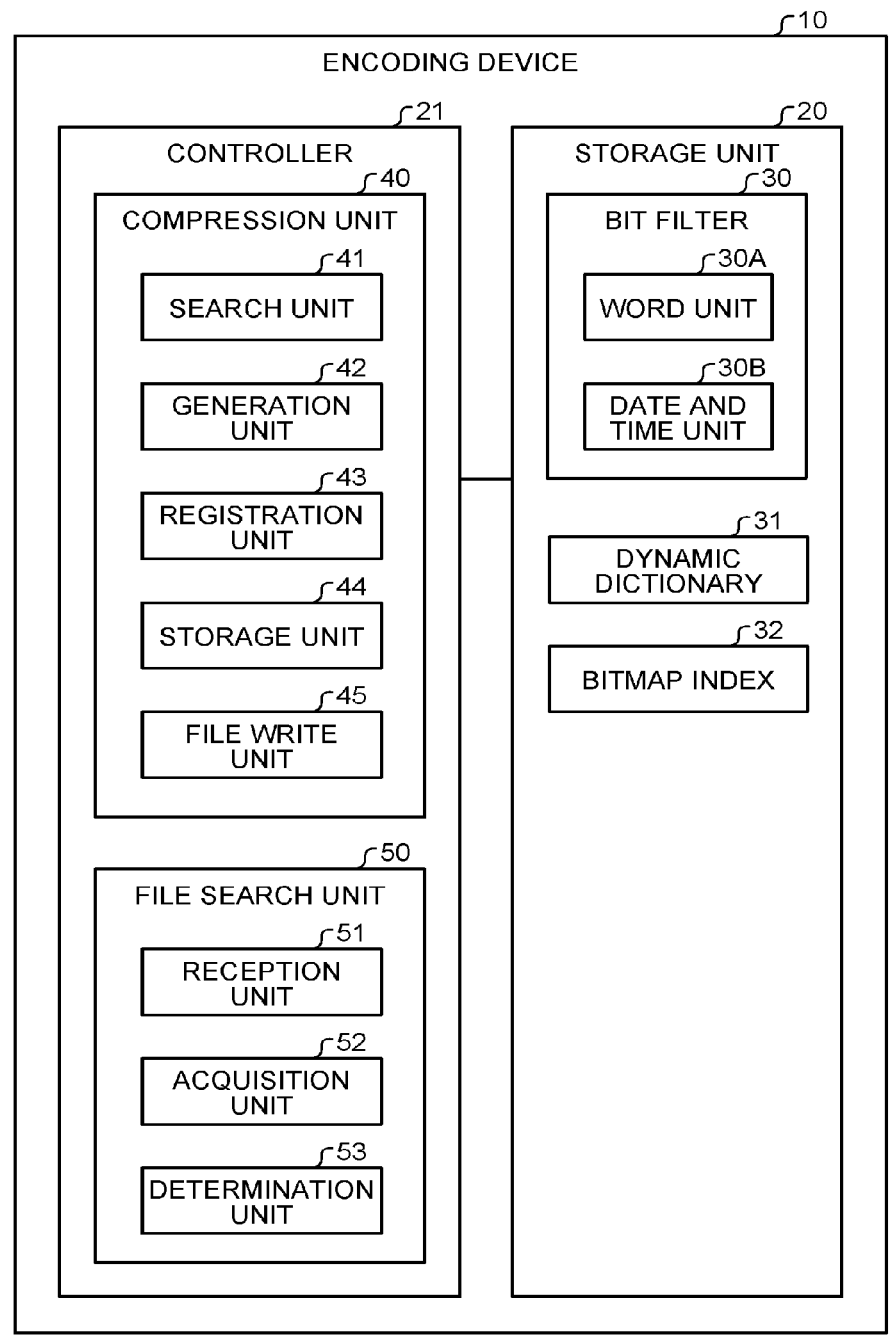
FIG. 3 is a diagram illustrating an example of a configuration of an encoding device.

Described next is a configuration of the encoding device 10. FIG. 3 is a diagram illustrating an example of a configuration of the encoding device. The encoding device 10 performs encoding such as compression of the subject file 1. The encoding device 10 is, for example, a computer such as a personal computer and a server computer, or an information processing device such as a tablet and a smartphone. The encoding device 10 may be a single computer, or may be implemented by cloud computing configured by a plurality of computers. In the context of the first embodiment, the encoding device 10 is configured as a single computer. As illustrated in FIG. 3, the encoding device 10 includes a storage unit 20 and a controller 21. The encoding device 10 may include other devices than those included in the computers or the information processing devices described above.

The storage unit 20 is a storage device such as a hard disk, a solid state drive (SSD), or an optical disc. The storage unit 20 may be a rewritable semiconductor memory such as a random access memory (RAM), a flash memory, or a non-volatile static random access memory (NVSRAM).

The storage unit 20 stores therein an operating system (OS) and various computer programs executed by the controller 21. For example, the storage unit 20 stores therein computer programs for input support. The storage unit 20 stores therein various kinds of data used in the computer programs executed by the controller 21. The storage unit 20 stores therein, for example, the bit filter 30, the dynamic dictionary 31, and the bitmap index 32.

The bit filter 30 is data having conversion information that associates words and date-time notation strings with word codes and compressed codes. The bit filter 30 includes the word unit 30A that stores various kinds of information relating to words, and the date and time unit 30B that stores various kinds of information relating to date and time notations. The bit filter 30 may integrate the word unit 30A and the date and time unit 30B to be a single unit.

Figure 4A:
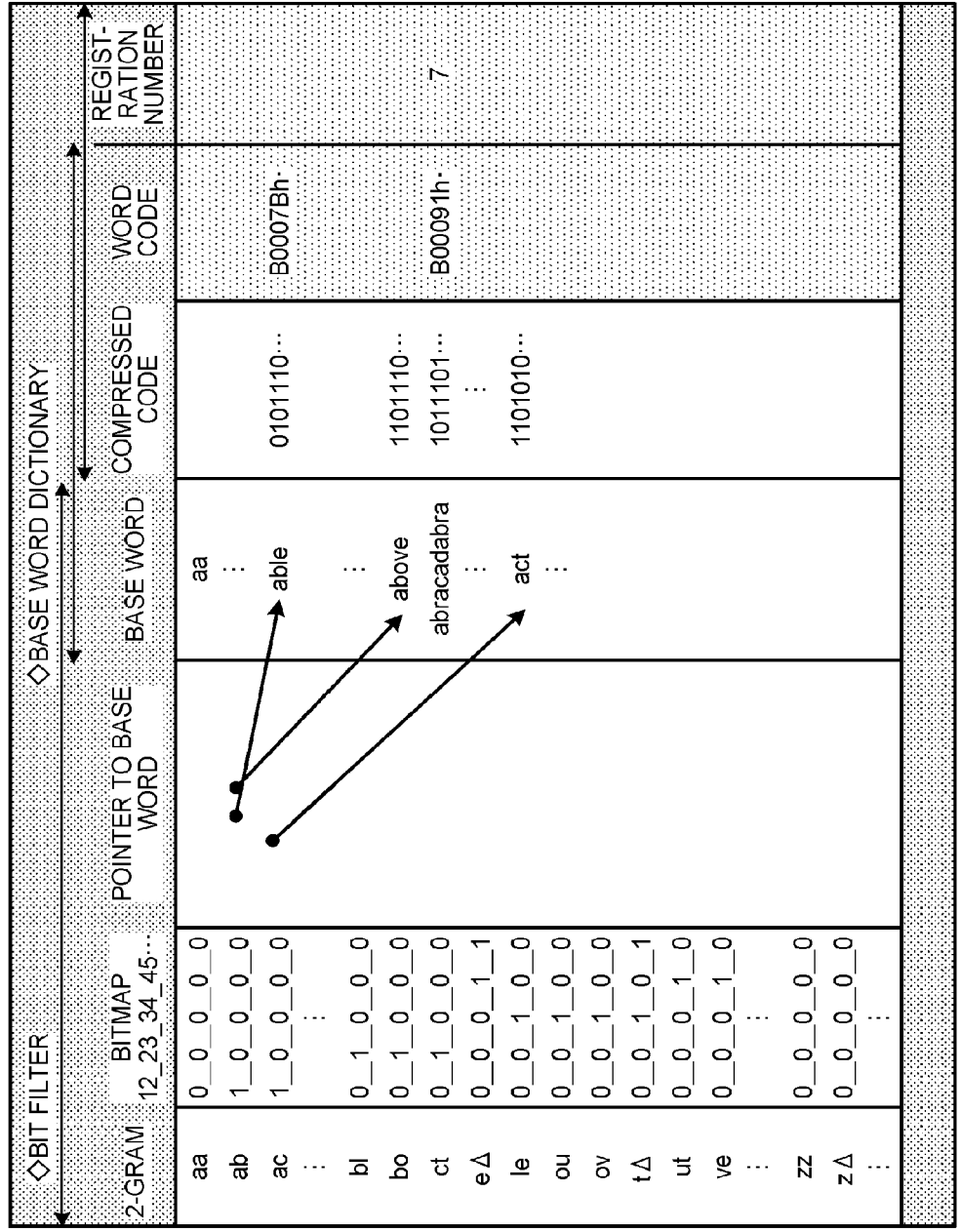
FIG. 4A is a diagram illustrating an example of a word unit in a bit filter.

The bit filter 30 will be described with reference to FIGS. 4A and 4B. FIG. 4A is a diagram illustrating an example of the word unit in the bit filter. FIG. 4B is a diagram illustrating an example of the date and time unit in the bit filter. As illustrated in FIGS. 4A and 4B, for example, the bit filter 30 includes items of "2-gram", "bitmap", "pointer to base word", "base word", "compressed code", "word code", and "registration number". Various words are registered as base words in the word unit 30A in the bit filter 30 illustrated in FIG. 4A. Various date-time notation strings are registered as base words in the date and time unit 30B in the bit filter 30 illustrated in FIG. 4B.

The item "2-gram" represents an area for storing 2-gram words included in each word. As illustrated in FIG. 4A, for example, the word "able" includes 2-gram words corresponding to "ab", "bl", and "le". The item "bitmap" represents an area for storing bit strings each indicating the position of the 2-gram word in a base word. When, for example, a bitmap of the 2-gram word "ab" is "1_0_0_0_0", this bitmap indicates that the first two characters of the base word are "ab". Bitmaps are mapped to base words by pointers. For example, the bitmap "1_0_0_0_0" of the 2-gram word "ab" is mapped to base words "able" and "above".

The item "base word" represents an area for storing words registered in advance as base words. In the word unit 30A in the bit filter 30 illustrated in FIG. 4A, for example, words extracted from a certain population are registered as base words. For example, about 190 thousand words listed in dictionaries are registered as base words. In the date and time unit 30B in the bit filter 30 illustrated in FIG. 4B, date-time notation strings represented in various notation formats are registered as base words. In FIG. 4B, for example, "02/14" representing February 14th is registered. The item "compressed code" represents an area for storing allocated compressed codes. In the first embodiment, base words registered in the word unit 30A in the bit filter 30 are classified into high-frequency words, which appear in texts relatively frequently, and low-frequency words, which appear relatively less frequently. In the first embodiment, base words up to 8,000th place in frequency order are classified as the high-frequency words, and base words in 8,001th place and below are classified as the low-frequency words. To the high-frequency words, short compressed codes are allocated in advance, and then stored in the item "compressed code" in advance. To the low-frequency words, compressed codes are dynamically allocated when they appear, and then stored in the item "compressed code" in advance. In other words, compressed codes of the high-frequency words are registered in advance, whereas compressed codes of the low-frequency words are not registered in the initial state. In the date and time unit 30B in the bit filter 30, compressed codes are dynamically allocated to base words when they appear, and then stored in the item "compressed code" in advance. In other words, compressed codes are not registered in the initial state.

The item "word code" represents an area for storing word codes uniquely allocated to the respective base words. Details of the word codes will be described later. The item "registration number" represents an area for storing registration numbers registered in the dynamic dictionary 31. The registration numbers are allocated in ascending, registration order to the codes registered in the dynamic dictionary 31.

Now, the word codes will be described. In the first embodiment, date-time notation strings represented by absolute date and time notation are classified into year notation patterns that represent years, month and day notation patterns that represent months and days, and time notation patterns that represent time. Word codes are assigned to the patterns in each group in chronological order to configure each coding system.

The following describes ranges of word codes used in the year notation patterns, the month and day notation patterns, and the time notation patterns.

The year notation patterns: Three bytes (C0000*h to C6FFF*h)

The month and day notation patterns: Three bytes (C7000*h to C7FFF*h)

The time notation patterns: Four bytes (C80000h to C9FFFFh)

Where, "*" will be determined depending on the notation formats of the date-time notation strings.

The coding systems of the year notation patterns, the month and day notation patterns, and the time notation patterns will be described. FIG. 5A is a diagram illustrating an example of a coding system of the year notation patterns. The year notation patterns are determined to be three bytes (24 bits) long. The five leftmost bits are fixed to "11000". The range from the 6th to the 20th bit from the leftmost bit is an area for storing years. This area stores years ranging from 0 to 9999. The range of the three leftmost bits of the four rightmost bits is an area for storing notation patterns of the years. The rightmost bit is an area for storing information on whether the year value indicates before Christ (BC) or after Christ (AC). Examples of the notation patterns of the years include numeric representations by one-byte numerals and by two-byte numerals, presence or absence of commas for indicating the number of digits, presence or absence of the word corresponding to "year" in Japanese, and representations in kanji. Certain values indicating notation patterns are allocated in advance to the respective notation patterns of the years. FIG. 5A illustrates an example of the values allocated to the respective notation patterns of the years. For example, "0" is allocated to a notation pattern represented by one-byte numerals with no commas such as "2013". For example, "4" is allocated to a notation pattern represented by one-byte numerals with the word corresponding to "year" in Japanese such as "year of 2013". The values corresponding to the respective notation patterns of the years are set in the range of the three leftmost bits of the four rightmost bits. In the rightmost bit, "1" is set when the year is before Christ, and "0" is set when the year is after Christ. The notation patterns of the years illustrated in FIG. 5A are presented for illustrative purposes only, and the embodiment is not limited thereto. The coding system of the year notation patterns illustrated in FIG. 5A is also presented for illustrative purposes only, and the embodiment is not limited thereto.

FIG. 5B is a diagram illustrating an example of a coding system of the month and day notation patterns. The month and day notation patterns are determined to be three bytes (24 bits) long. The eight leftmost bits are fixed to "11000111". The range from the 9th to the 12th bit from the leftmost bit is an area for storing months. This area stores months ranging from January to December. The range from the 13th to the 15th bit from the leftmost bit is fixed to "000". The range from the 16th to the 20th bit from the leftmost bit is an area for storing days. This area stores days ranging from 1 to 31. The areas for storing months and days are presented for illustrative purposes only, and other ranges may be used. The range of the four rightmost bits is an area for storing notation patterns of the months and days. Examples of the notation patterns of the months and days include representations using characters and a period, representations using numerals and a slash, numeric representations by one-byte numerals and by two-byte numerals, presence or absence of the words corresponding to "month" and "day" in Japanese, and representations in kanji. Certain values indicating notation patterns are allocated in advance to the respective notation patterns of the months and days. FIG. 5B illustrates an example of the values allocated to the respective notation patterns of the months and days. For example, "0" is allocated to a notation pattern using characters and a period such as "Apr. 1st". For example, "4" is allocated to a notation pattern represented by one-byte numerals with the words corresponding to "month" and "day" in Japanese such as "1st day of the 4th month". The values corresponding to the respective notation patterns of the years are set in the range of the four rightmost bits. The notation patterns of the years illustrated in FIG. 5B is presented for illustrative purposes only, and the embodiment is not limited thereto. The coding system of the month and day notation patterns illustrated in FIG. 5B is also presented for illustrative purposes only, and the embodiment is not limited thereto.

Figure 5C:
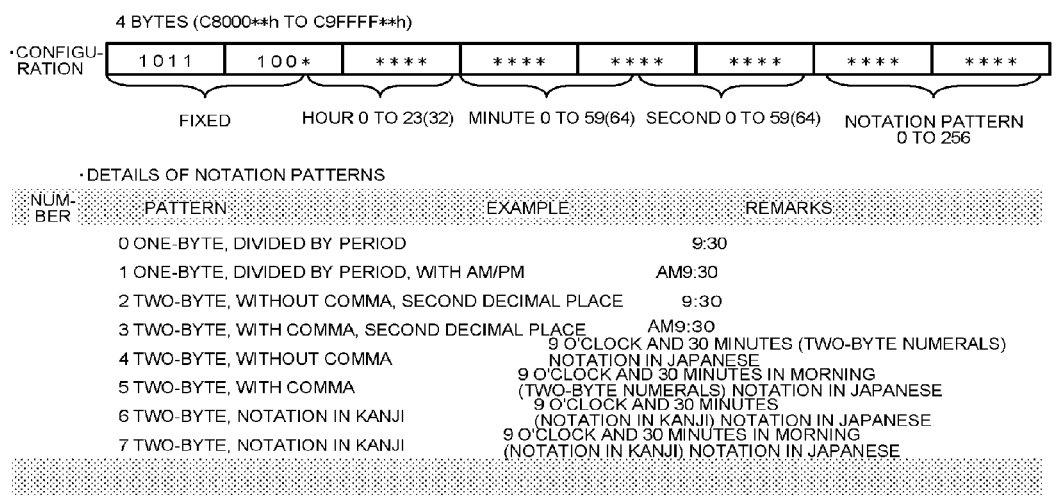
FIG. 5C is a diagram illustrating an example of a coding system of time notation patterns.

FIG. 5C is a diagram illustrating an example of a coding system of the time notation patterns. The time notation patterns are determined to be four bytes (32 bits) long. The seven leftmost bits are fixed to "1011100". The range from the 8th to the 12th bit from the leftmost bit is an area for storing hours. This area stores hours ranging from 0 to 23. The range from the 13th to the 18th bit from the leftmost bit is an area for storing minutes. This area stores minutes ranging from 0 to 59. The range from the 19th to the 23th bit from the leftmost bit is an area for storing seconds. This area stores seconds ranging from 0 to 59. The areas for storing hours, minutes, and seconds are presented for illustrative purposes only, and other ranges may be used. The range of the four rightmost bits is an area for storing notation patterns of the times. Examples of the notation patterns of the time include the 24-hour time notation, the 12-hour time notation, numeric representations of hours, minutes, and seconds divided by colons, numeric representations by one-byte numerals and by two-byte numerals, presence or absence of the words corresponding to "hour", "minute", and "second" in Japanese, and representations in kanji. Certain values indicating notation patterns are allocated in advance to the respective notation patterns of the time. FIG. 5C illustrates an example of the values allocated to the respective notation patterns of the time. For example, "0" is allocated to a notation pattern in the 24-hour time notation using one-byte numerals with a colon such as "9:30". For example, "5" is allocated to a notation pattern in the 12-hour time notation using two-byte numerals with the words corresponding to "hour" and "minute" in Japanese such as "9 hours and 30 minutes in the morning". The values corresponding to the respective notation patterns of the time are set in the range of the four rightmost bits. The notation patterns of the time illustrated in FIG. 5C are presented for illustrative purposes only, and the embodiment is not limited thereto. The coding system of the time notation patterns illustrated in FIG. 5C is also presented for illustrative purposes only, and the embodiment is not limited thereto.

In the first embodiment, word codes for relative date and time notation patterns that relatively indicate dates and time are determined in the following manner.

Figure 5D:
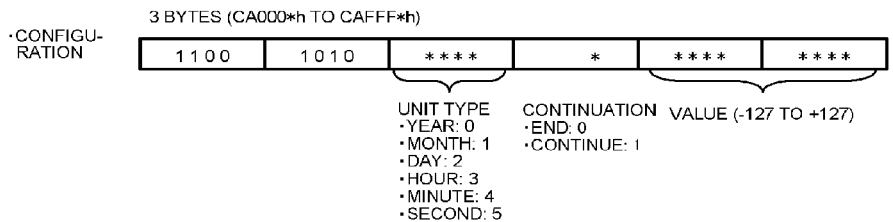
FIG. 5D is a diagram illustrating an example of a coding system of relative date and time notation patterns.

FIG. 5D is a diagram illustrating an example of a coding system of the relative date and time notation patterns. The codes of the relative date and time notation patterns are determined to be three bytes (24 bits) long. The eight leftmost bits are fixed to "11001010". The range from the 9th to the 12th bit from the leftmost bit is an area for storing the unit types of the specified date and time. Certain values indicating unit type patterns are allocated in advance to the respective unit types of date and time used in relative date and time notations. FIG. 5D illustrates an example of the unit types of date and time used in relative date and time notations and values allocated to the unit types. For example, "0" is allocated to a unit type "year". The 15th bit from the leftmost bit is an area for storing a continuation flag indicating whether another code that specifies relative date and time follows. If another code follows, the continuation flag is set to "1". If not, the continuation flag is set to "0". The range from the 17th to the 24th bit from the leftmost bit is an area for storing specific values of the relative date and time notations. This area stores values ranging from −127 to +127. The unit type patterns illustrated in FIG. 5D are presented for illustrative purposes only, and the embodiment is not limited thereto. The coding system of the relative date and time notation patterns illustrated in FIG. 5D is presented for illustrative purposes only, and the embodiment is not limited thereto.

In representing a relative date and time, the relative date and time may be specified by combining a plurality of unit types such as hours and minutes in some cases. When a plurality of unit types are combined to specify a relative date and time, codes of relative date and time notation patterns are concatenated by using the continuation flag. For example, a code of a relative date and time "after an hour and 10 minutes" is formed by concatenating a code "CA3001h" indicating after an hour with a code "CA400Ah" indicating after 10 minutes. In this case, the continuation flag of "CA3001h" is set to "1". Thus, the generated code indicating "after an hour and 10 minutes" is "CA3101CA400Ah". The continuation flag is also used when a code of an absolute date and time is concatenated.

Figures 6, 7:
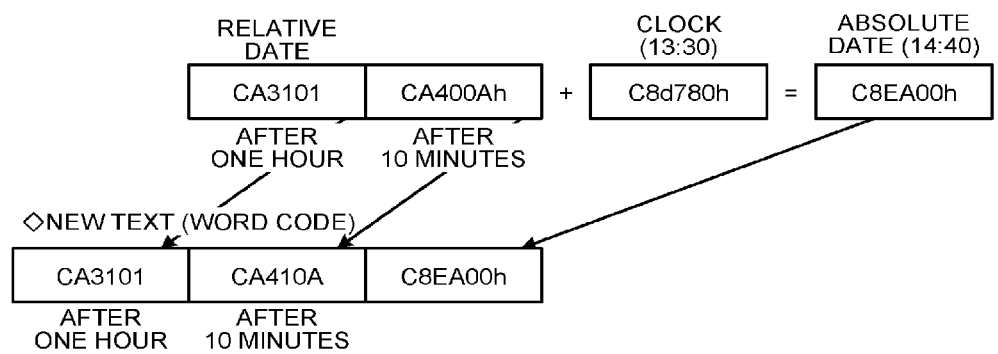
FIG. 6 is a diagram illustrating an example of how a code of an absolute date and time is concatenated with a code of a relative date and time notation pattern.
FIG. 7 is a diagram illustrating an example of a data configuration of a dynamic dictionary.

FIG. 6 is a diagram illustrating an example of concatenating a code of an absolute date and time with a code of a relative date and time notation pattern. For example, the time "after an hour and 10 minutes" from a reference time "13:30" is "14:40". The code of the time notation pattern "14:40" is "C8EA00h".

When the code "C8EA00h" of the absolute time is concatenated with the code "CA3101CA400Ah" of the relative time "after an hour and 10 minutes", the continuation flag of "CA400Ah" is set to "1". Thus, the code formed by concatenating "C8EA00h" with "CA3101CA400Ah" is "CA3101CA410AC8EA00h". Also in FIG. 1, for example, the continuation flag of "CA1001h" is set to "1" to concatenate the word code "C720E1h" corresponding to "2/14" with the word code "CA1001h" corresponding to "yesterday". Thus, the code formed by concatenating "C720E1h" with "CA1001h" is "CA1101C720E1h".

The continuation flag is a bit for indicating that another code is concatenated with a code of a relative date and time notation pattern, and is not a bit for indicating a specific date and time notation. Thus, the continuation flag is excluded from comparison bits when codes of relative date and time notation patterns are compared. When, for example, codes of relative date and time notation patterns are compared, the continuation flag is dealt with as "0" in the comparison. For example, a portion "CA1101" of the code "CA1101C720E1h" is dealt with as "CA1001" in the comparison. With this configuration, "CA1101C720E1h" will be found in searching for the word code "CA1001h", which corresponds to "yesterday", for example.

Returning to FIG. 3, the dynamic dictionary 31 stores therein compressed codes that are dynamically allocated to the base words. FIG. 7 is a diagram illustrating an example of a data configuration of the dynamic dictionary. As illustrated in FIG. 7, for example, the dynamic dictionary 31 includes items "registration number", "compressed code", and "code".

The item "registration number" represents an area for storing registration numbers. The item "compressed code" represents an area for storing compressed codes each registered in association with a code. The item "code" represents an area for storing codes each registered in association with a compressed code. In FIG. 7, for example, a compressed code "A003h" and a code "A001A7h" are stored in a registration number "3".

Returning to FIG. 3, the bitmap index 32 contains indices for storing information on presence or absence of each word. An index is an information bit string representing which file contains which word. The bitmap index 32 stores information on presence or absence of each word in each file.

FIG. 8 is a diagram illustrating an example of a data configuration of the bitmap index. The bitmap index 32 includes a first storage area 32A that stores information on presence or absence of the high-frequency words in a file, and a second storage area 32B that stores information on presence or absence of the low-frequency words and date-time notation strings in the file. The first storage area 32A is provided in advance to store information on presence or absence of the high-frequency words in a file. In other words, the first storage area 32A reserves as many storage areas as the number of the high-frequency words in advance. In FIG. 8, for example, the first storage area 32A includes in advance storage areas for storing information on presence or absence of the 8,000 high-frequency words in n files. In the second storage area 32B, however, storage areas for storing information on presence or absence of the low-frequency words and the date-time notation strings in the files are added when any low-frequency words or date-time notation strings appear in the files. In other words, a new storage area is provided for the second storage area 32B every time a new low-frequency word or a new date-time notation string appears in a file. In FIG. 8, for example, the second storage area 32B includes in advance storage areas for storing information on presence or absence of the 24,000 low-frequency words and date-time notation strings in n files.

The bitmap index 32 records "1" when a string corresponding to a compressed code appears in a file of a certain file number, and records "0" when the string corresponding to the compressed code does not appear in the file. In FIG. 8, for example, the bitmap index 32 stores "1"s in the positions of the file number "1" with respect to the words "Apr. 1st", "The", "aardvark", and "eats". The bitmap index 32 can narrow file options down to a file containing certain words and date-time notation strings by determining bits for each file. In FIG. 8, for example, the bitmap index 32 stores "1"s in the positions of the file number "1" with respect to the words "Apr. 1st", "The", "aardvark", and "eats", and thus, a file containing the words "Apr. 1st", "The", "aardvark", and "eats" can be determined to be the file of the file number "1".

Returning to FIG. 3, the controller 21 is a device for controlling the encoding device 10. The controller 21 may be an electronic circuit such as a central processing unit (CPU) and a micro processing unit (MPU), or an integrated circuit such as an application specific integrated circuit (ASIC) and a field programmable gate array (FPGA). The controller 21 includes an internal memory for storing computer programs that define the procedure of various kinds of processing, and control data. The controller 21 uses them to execute the processing. The controller 21 functions as various types of processing units by executing various computer programs. For example, the controller 21 includes a compression unit 40 and the file search unit 50.

The compression unit 40 extracts words and date-time notation strings from a subject file to be compressed, and generates the compressed file 2 containing compressed codes corresponding to the respective words and date-time notation strings. The compression unit 40 includes a search unit 41, a generation unit 42, a registration unit 43, a storage unit 44, and a file write unit 45. The following describes in detail the units of the compression unit 40.

The search unit 41 reads the subject file 1 to be compressed, and searches the subject file 1 for date-time notation strings that represent at least date or time. For example, the search unit 41 searches for date-time notation strings representing date and/or time. In other words, the search unit 41 searches for a date-time notation string representing either one of date and time, or representing both date and time. For example, the search unit 41 searches for symbols, numerals, words, and characters used in representing date and time in various notation formats, determines the notation format of the preceding and the following strings of a found part, thereby finding a date-time notation string. The search unit 41 also extracts words from the remaining part other than the date-time notation strings. For example, when a text such as an English text contains words separated by certain delimiters such as a space, the search unit 41 divides strings into words on the basis of the delimiters in the strings to extract words therefrom. When, for example, a text such as a Japanese text contains words that are not separated by certain delimiters, the search unit 41 performs the natural language processing, such as the morphological analysis and the syntactical analysis, corresponding to the language of the text to extract words from the strings.

The generation unit 42 collates the found date-time notation strings with the date and time unit 30B in the bit filter 30 to acquire word codes corresponding to the respective date-time notation strings, and generates codes representing the date-time notation strings. For example, when a date-time notation string is represented by absolute date and time notation, the generation unit 42 collates the string with the date and time unit 30B in the bit filter 30 to acquire a word code corresponding to the date-time notation string, and uses the acquired word code as a code representing the date-time notation string. When the date-time notation string is represented by relative date and time notation, the generation unit 42 calculates the absolute date and time indicated by the date-time notation string on the basis of a certain reference date and time. The generation unit 42 collates the date-time notation string with the date and time unit 30B in the bit filter 30 to acquire a word code corresponding to the relative date-time notation string and a word code corresponding to the absolute date and time. The generation unit 42 then adds the word code of the absolute date and time to the word code of the relative date-time notation string to generate a code indicating the date and the time notation string. The generation unit 42 may determine whether the date-time notation string is represented by absolute date and time notation or relative date and time notation from the notation format of the string. In some embodiments, for example, the date and time unit 30B in the bit filter 30 may store a flag for each date-time notation string to indicate whether the string is represented by absolute date and time notation or by relative date and time notation. The generation unit 42 may exploit the flags to determine whether the date-time notation string is represented by absolute date and time notation or relative date and time notation.

The registration unit 43 registers, in the dynamic dictionary 31, compressed codes of the date-time notation strings and words that have been found in the subject file 1. For example, the registration unit 43 refers to a record of the word unit 30A or the date and time unit 30B in the bit filter 30, corresponding to the date-time notation string or the word that has been found. The registration unit 43 determines whether the compressed code of the date-time notation string or the word that has been found in the subject file 1 is registered in the dynamic dictionary 31 by determining whether the compressed code is registered in the item of compressed code in the record.

When the compressed code of the date-time notation string or the word that has been found in the subject file 1 is registered in the bit filter 30, the next processing is performed by the storage unit 44.

When the compressed code of the date-time notation string or the word that has been found in the subject file 1 is not registered in the bit filter 30, the registration unit 43 allocates a compressed code to the date-time notation string or the word. The registration unit 43 obtains a new dynamic number, associates the number with the code and the compressed code, and registers them in the dynamic dictionary 31. The registration unit 43 also registers the compressed code registered in the dynamic dictionary 31 in the item of compressed code in the bit filter 30.

The storage unit 44 stores information in the bitmap index 32. The bitmap index 32 stores information on presence or absence of each date-time notation string and each word found in the subject file 1. The storage unit 44 determines whether the compressed code of a date-time notation string or a word found in the subject file 1 is registered in the bitmap index 32.

When determining that the compressed code is registered, the storage unit 44 records presence of the date-time notation string or the word in a position of a file number corresponding to the subject file 1 in a record of the compressed code.

When determining that the compressed code is not registered, the storage unit 44 adds a new record to the second storage area 32B in the bitmap index 32 for the compressed code, and records presence of the date-time notation string or the word in a position of a file number corresponding to the subject file 1 in the record.

The file write unit 45 converts the subject file 1 on the basis of the bit filter 30 and outputs the converted data. For example, the file write unit 45 acquires, from the bit filter 30, compressed codes corresponding to the date-time notation strings and words found in the subject file 1. The file write unit 45 outputs the acquired compressed codes to the compressed file 2.

The file search unit 50 searches for a file in accordance with a specified search condition. The file search unit 50 includes a reception unit 51, an acquisition unit 52, and a determination unit 53. The following describes in detail the units of the file search unit 50.

The reception unit 51 receives an input of a date as a search condition. For example, the reception unit 51 provides an input interface such as an operating screen for receiving an input of a date, and receives the input date as a search condition.

The acquisition unit 52 acquires a word code corresponding to the input date. For example, the acquisition unit 52 refers to the date and time unit 30B in the bit filter 30, and acquires a word code corresponding to the input date.

The determination unit 53 determines a file containing a date-time notation string corresponding to the input date. For example, the determination unit 53 refers to the dynamic dictionary 31 and searches for a compressed code of a code including the acquired word code. The determination unit 53 refers to the bitmap index 32, and determines a file containing the found compressed code.

The reception unit 51 may receive an input of a search condition by range specification of dates and time. When a search condition is input by way of range specification, the acquisition unit 52 acquires word codes corresponding to a start date and time and an end date and time of the range. The determination unit 53 refers to the dynamic dictionary 31 and searches for the compressed codes of codes including word codes having bit values relating to date and time between the bit value of the word code of the start date and time and the bit value of the word code of the end date and time. The determination unit 53 refers to the bitmap index 32, and determines a file containing the found compressed codes.

FIG. 9 is a schematic diagram illustrating the procedure of date and time search by way of range specification. FIG. 9 illustrates, for example, a case in which a range from "2/13 to 2/15" is specified as a search condition. The file search unit 50 acquires word codes corresponding to the start date and time and the end date and time of the range, respectively, from the date and time unit 30B in the bit filter 30. In FIG. 9, for example, the file search unit 50 acquires a word code "C720D1h" corresponding to the start date "2/13" of the range and a word code "C720F1h" corresponding to the end date "2/15" of the range. The file search unit 50 refers to the dynamic dictionary 31 and searches for the compressed codes of codes including word codes between "C720D1h" and "C720F1h". In FIG. 9, for example, the code "CA1101C720E1h" of the compressed code "A005h" includes a code "C720E1h". A portion "CA1101" of "CA1101C720E1h" corresponds to "yesterday", which is a relative date. A portion "C720E1" of "CA1101C720E1h" corresponds to "2/14", which is an absolute date. In FIG. 9, for example, the compressed code "A005h" is found. The file search unit 50 refers to the bitmap index 32, and determines a file containing the found compressed code. In FIG. 9, for example, the file search unit 50 determines that the file with an index value "2" contains the compressed code "A005h". In other words, the encoding device 10 can search for a file containing a date and time in a specified range when a search is performed by way of range specification. The encoding device 10 can search for the file when the date and time is recorded by relative date and time notation, by using a date and time represented by absolute date and time notation.

As described above, the encoding device 10 can find strings in different date and time notation formats all together without making any change on the subject file 1. The encoding device 10 can determine the compressed file 2 containing a specified date and time, or a specified range of dates and time without decompressing it.

Procedure of Processing

Figure 10A:
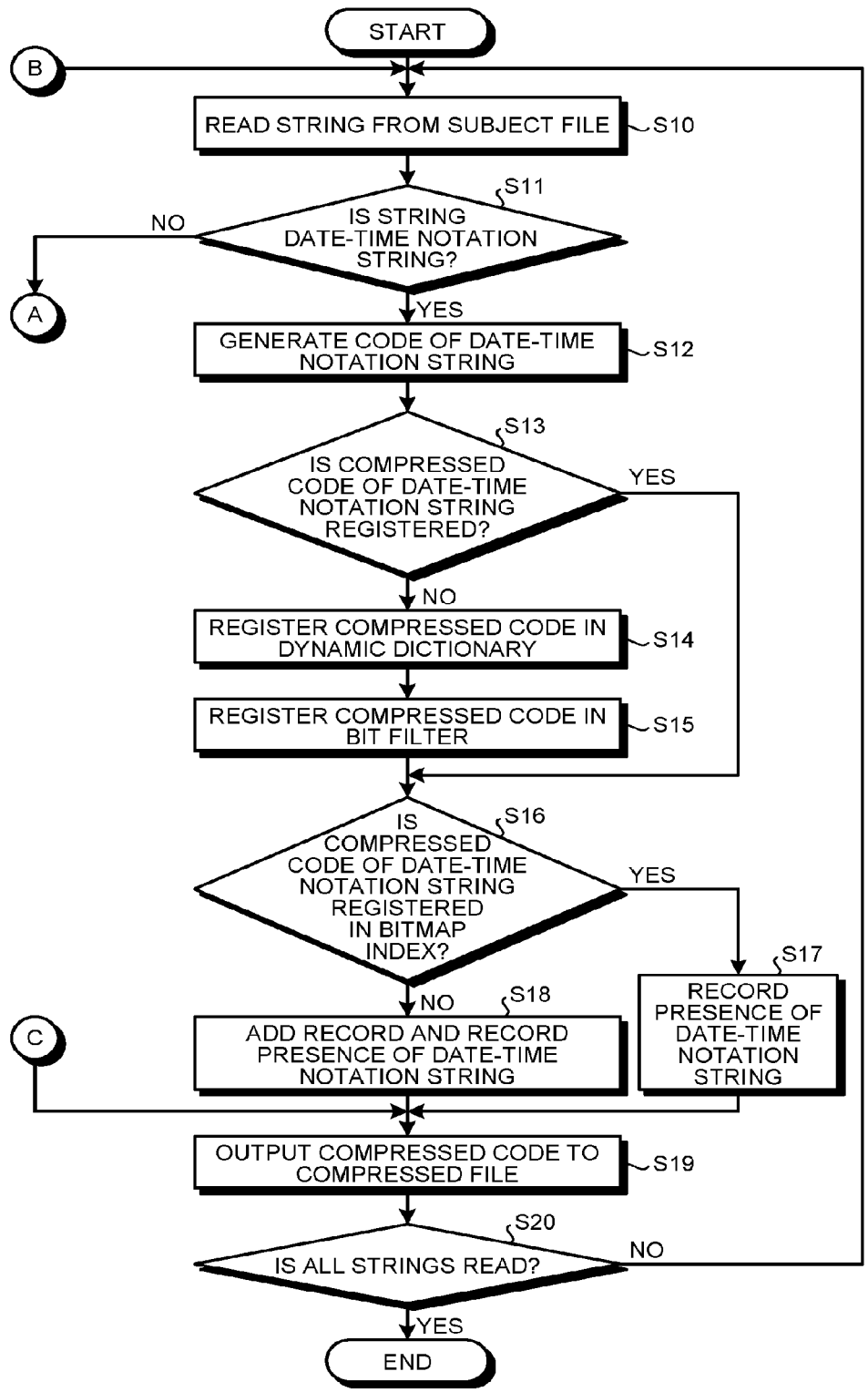
FIG. 10A is a flowchart illustrating an example of the procedure of compression processing.
Figure 10B:
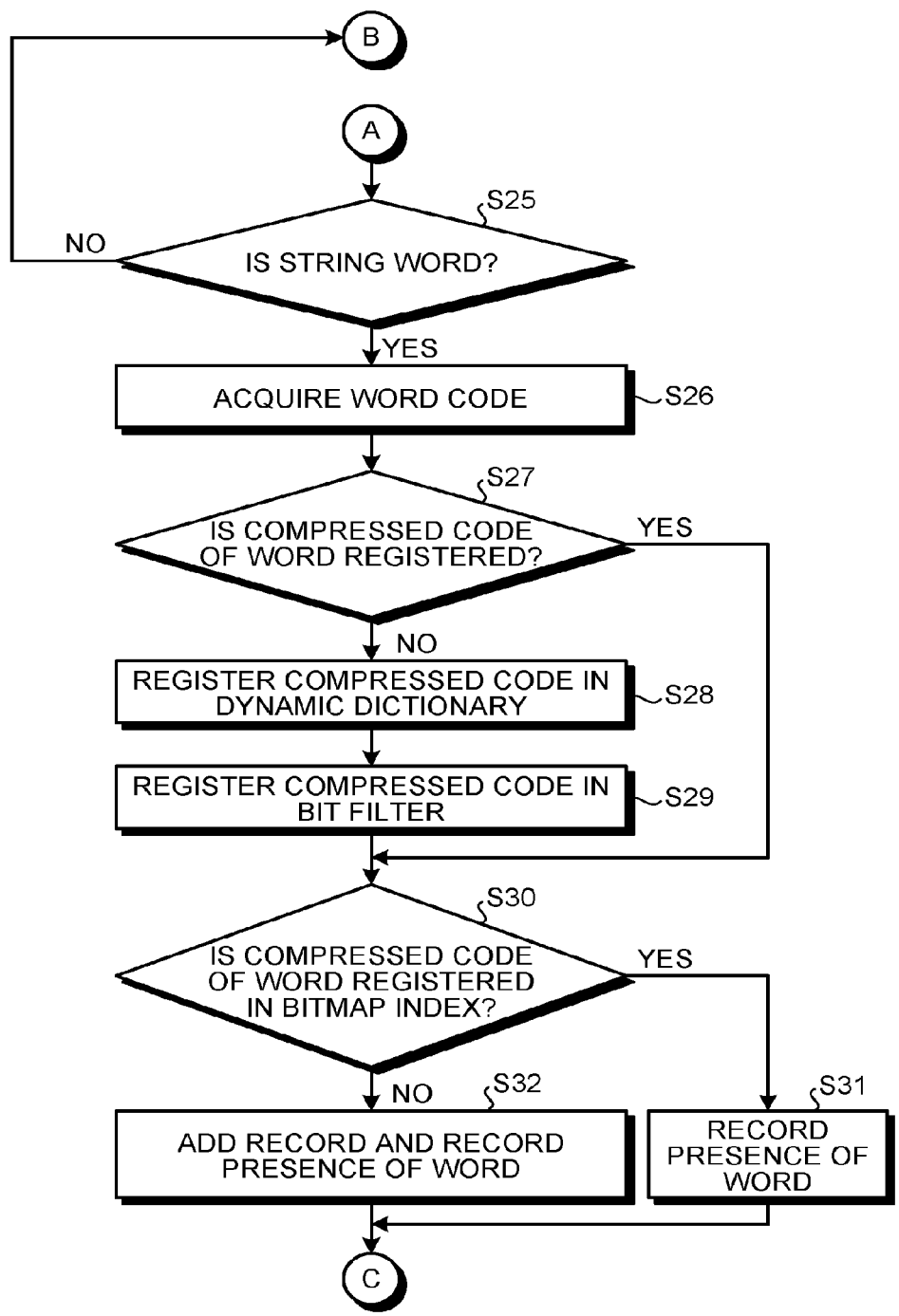
FIG. 10B is a flowchart illustrating an example of the procedure of compression processing.

Described next is various kinds of processing performed by the encoding device 10 according to the first embodiment. Described first is the procedure of compression processing in which the encoding device 10 according to the first embodiment encodes and compresses the subject file 1. FIGS. 10A and 10B are flowcharts illustrating an example of the procedure of the compression processing. This compression processing is performed at certain timing, for example, timing at which the subject file 1 is specified and a certain operation is performed to instruct start of the compression processing.

As illustrated in FIG. 10A, the search unit 41 reads strings from the subject file 1 one by one (step S10). The search unit 41 determines whether a read string is a date-time notation string (step S11). If the string is a date-time notation string (Yes at step S11), the generation unit 42 collates the date-time notation string with the date and time unit 30B in the bit filter 30, acquires a word code corresponding to the date-time notation string, and generates a code representing the date-time notation string (step S12). The registration unit 43 determines whether the compressed code of the date-time notation string is registered in the date and time unit 30B in the bit filter 30 (step S13). If the compressed code is registered (Yes at step S13), the encoding device 10 performs the processing at step S16 to be described later.

If the compressed code is not registered (No at step S13), the registration unit 43 allocates a compressed code to the date-time notation string, obtains a new dynamic number, associates the dynamic number with the compressed code and the code, and registers them in the dynamic dictionary 31 (step S14). The registration unit 43 also registers the compressed code registered in the dynamic dictionary 31 in the item of compressed code in the bit filter 30 (step S15).

The storage unit 44 determines whether the compressed code of the date-time notation string is registered in the bitmap index 32 (step S16). If the compressed code is registered (Yes at step S16), the storage unit 44 records presence of the date-time notation string in a position of a file number corresponding to the subject file 1 in a record of the compressed code (step S17). If the compressed code is not registered (No at step S16), the storage unit 44 adds a record for the compressed code to the second storage area 32B in the bitmap index 32, and records presence of the date-time notation string in a position of the file number corresponding to the subject file 1 in the record (step S18).

The file write unit 45 outputs the compressed code corresponding to the date-time notation string to the compressed file 2 (step S19).

The search unit 41 determines whether all the strings in the subject file 1 are read (step S20). If all the strings are read (Yes at step S20), the processing is ended. If not (No at step S20), the encoding device 10 performs the processing at step S10 described above.

If a read string is not a date-time notation string (No at step S11), the search unit 41 determines whether the read string is a word as illustrated in FIG. 10B (step S25). If the read string is not a word (No at step S25), the encoding device 10 performs the processing at step S10 described above illustrated in FIG. 10A, and reads a new string. If the read string is a word (Yes at step S25), the generation unit 42 collates the word with the word unit 30A in the bit filter 30, and acquires a word code corresponding to the word (step S26). The registration unit 43 determines whether the compressed code of the word is registered in the word unit 30A in the bit filter 30 (step S27). If the compressed code is registered (Yes at step S27), the encoding device 10 performs the processing at step S30 to be described later.

If the compressed code is not registered (No at step S27), the registration unit 43 allocates a compressed code to the word, obtains a new dynamic number, associates the dynamic number with the code and the compressed code, and registers them in the dynamic dictionary 31 (step S28). The registration unit 43 registers the compressed code registered in the dynamic dictionary 31 in the item of compressed code in the bit filter 30 (step S29).

The storage unit 44 determines whether the compressed code of the word is registered in the bitmap index 32 (step S30). If the compressed code is registered (Yes at step S30), the storage unit 44 records presence of the word in a position of a file number corresponding to the subject file 1 in a record of the compressed code (step S31). If the compressed code is not registered (No at step S30), the storage unit 44 adds a record for the compressed code to the second storage area 32B in the bitmap index 32, and records presence of the word in a position of a file number corresponding to the subject file 1 in the record (step S32). The encoding device 10 then performs the processing at step S19 illustrated in FIG. 10A.

Figure 11:
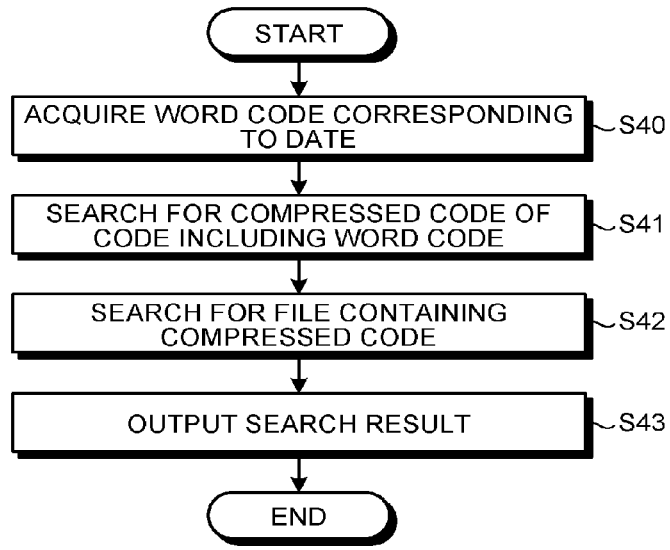
FIG. 11 is a flowchart illustrating an example of the procedure of search processing.

Described next is the procedure of search processing in which the encoding device 10 according to the first embodiment searches for a file containing a date-time notation string corresponding to an input date. FIG. 11 is a flowchart illustrating an example of the procedure of the search processing. This search processing is performed at certain timing, for example, timing at which a date is specified and a certain operation is performed to instruct start of the search processing.

As illustrated in FIG. 11, the acquisition unit 52 refers to the date and time unit 30B in the bit filter 30 and acquires a word code corresponding to an input date (step S40). The determination unit 53 refers to the dynamic dictionary 31 and searches for the compressed code of a code containing the acquired word code (step S41). The determination unit 53 refers to the bitmap index 32 and determines a file containing the found compressed code (step S42). The determination unit 53 outputs the determined file as a search result (step S43), and the processing is ended. The search result may be output to a file, to a display unit such as a display, or to an external device.

Advantageous Effects

As described above, the encoding device 10 according to the first embodiment searches the subject file 1 for a date-time notation string that represents at least a date or time. The encoding device 10 generates, upon finding the date-time notation string, a converted date and time code including an identification code for identifying the date-time notation string and a normalized date and time notation formed by converting the date-time notation string into a certain date and time notation format. The encoding device 10 outputs the subject file 1 after converting the subject file 1 on the basis of the bit filter 30 that associates the converted date and time code with the date-time notation string. This configuration enables the encoding device 10 to find strings in different date and time notation formats all together without making any change on the text data in the search subject.

The encoding device 10 according to the first embodiment uses, as the normalized date and time notation, an absolute date and time notation that represents a date or time in a uniquely identifiable sense. This configuration enables the encoding device 10 to compare strings in different date and time notation formats all together by comparing normalized date and time notations.

The encoding device 10 according to the first embodiment generates a converted date and time code including a code corresponding to the normalized date and time notation and to which chronological order is given. This configuration enables the encoding device 10 to determine the order of date and time by comparing codes included in converted date and time codes.

The encoding device 10 according to the first embodiment dynamically allocates a compressed code to a date-time notation string that has appeared in the subject file 1, associates the compressed code with the normalized date and time notation of the date-time notation string, and registers the compressed code of the date-time notation string in a dictionary. The encoding device 10 outputs, after converting the date-time notation string in the subject file 1 into the compressed code of the date-time notation string registered in the dictionary, the compressed code. This configuration enables the encoding device 10 to compress the subject file 1 into a searchable format in which dates and time in different date and time notation formats can be found all together without performing decompression processing.

[b] Second Embodiment

Although the encoding device according to the first embodiment has been described, the technology disclosed above may be implemented in other different forms than the above embodiment. The following describes a second embodiment of the present invention.

In the context of the first embodiment above, the coding system is configured such that the date-time notation strings are classified into year, month and day, and time, and word codes are assigned in chronological order in each group, but the second embodiment is not limited thereto. The word codes may be assigned to a group of year, month, and day, a group of month, day, and time, or a group of year, month, day, and time, in chronological order.

In the context of the first embodiment above, codes of normalized date and time notations included in the word codes for the year notation patterns, the month and day notation patterns, and the time notation patterns represent absolute date and time notations that directly represent date and time such as years, months and days, and days and time, but the second embodiment is not limited thereto. Codes of normalized date and time notations included in the word codes may be codes of, for example, relative date and time notations that represent date or time relative to a reference date or time. For example, the codes of normalized date and time notations may be codes of relative date and time notations represented relative to a certain date or time specified by a user, or a date or time at which a certain reference event occurred.

In the context of the first embodiment above, word codes of date-time notation strings in various notation formats are registered in advance in the date and time unit 30B in the bit filter 30, but the second embodiment is not limited thereto. For example, the generation unit 42 may generate, when a date-time notation string is found, a word code in accordance with the date and time represented by the date-time notation string and its notation format, so as to generate a code representing the date-time notation string.

The components of each unit illustrated in the drawings are only for conceptually illustrating the functions thereof and are not necessarily physically configured as illustrated in the drawings. In other words, specific forms of disintegration or integration of the units are not limited to those illustrated in the drawings. Specifically, all or part of the units can be configured by functionally or physically separating or integrating them in any unit depending on various loads or use conditions. For example, the processing units included in the compression unit 40 (search unit 41, generation unit 42, registration unit 43, storage unit 44, file write unit 45) and in the file search unit 50 (reception unit 51, acquisition unit 52, determination unit 53) may be integrated as appropriate. Processing performed by each processing unit may be separated into a plurality of processes and assigned to a plurality of processing units as appropriate. Furthermore, all or any part of the processing functions performed by each processing unit can be implemented by a CPU and by computer programs analyzed and executed by the CPU, or implemented as hardware by wired logic.

Hardware Configuration of Encoding Device

Figure 12:
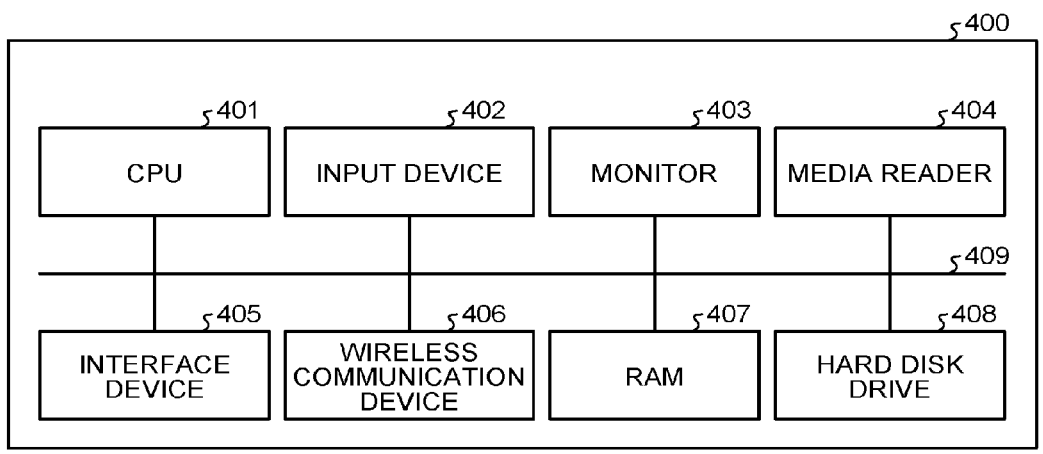
FIG. 12 is a diagram illustrating a hardware configuration of an encoding device.

FIG. 12 is a diagram illustrating the hardware configuration of the encoding device. As illustrated in FIG. 12, a computer 400 includes a CPU 401 that executes various types of processing, an input device 402 that receives an input of data from a user, and a monitor 403. The computer 400 also includes a media reader 404 that reads computer programs or the like from storage media, an interface device 405 for coupling the computer to other devices, and a wireless communication device 406 for coupling the computer to other devices through wireless connection. The computer 400 also includes a random access memory (RAM) 407 that temporarily stores various types of information, and a hard disk drive 408. All of the devices 401 to 408 are coupled to a bus 409.

The hard disk drive 408 stores therein an encoding program having, for example, the same functions as those of the processing units of the compression unit 40 and the file search unit 50 illustrated in FIG. 3. The hard disk drive 408 also stores therein various kinds of data for implementing the encoding program.

The CPU 401 reads computer programs stored in the hard disk drive 408, loads them on the RAM 407, and executes them to perform various kinds of processing. These computer programs can cause the computer 400 to function as, for example, the compression unit 40 and the file search unit 50 illustrated in FIG. 3.

The encoding program described above is not necessarily stored in the hard disk drive 408. For example, the computer 400 may read the computer programs stored in storage media that can be read by the computer 400, thereby executing the computer programs. Examples of the storage media that can be read by the computer 400 include portable recording media such as a compact disc read only memory (CD-ROM), a digital versatile disc (DVD), and a universal serial bus (USB), semiconductor memories such as a flash memory, and a hard disk drive. The computer programs may also be stored in a device coupled to a public network, the Internet, or the local area network (LAN), for example, from which the computer 400 may read the computer programs and execute them.

Figure 13:
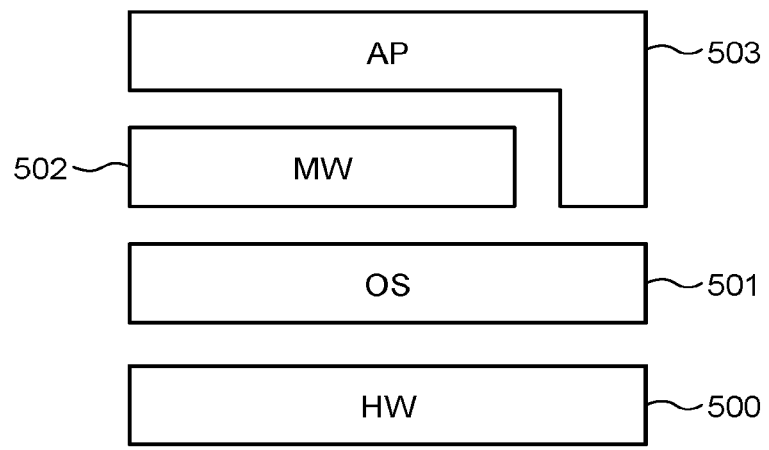
FIG. 13 is a diagram illustrating a configuration example of computer programs run on a computer.

FIG. 13 is a diagram illustrating a configuration example of computer programs running on a computer. In the computer 400, an operating system (OS) 501 for controlling the pieces of hardware 500 as illustrated in FIG. 12 (the components 401 to 409) operates. The CPU 401 operates in accordance with the procedure of the OS 501, thereby controlling and administering the pieces of hardware 500. As a result, the processing in accordance with an application program 503 and middleware 502 is executed on the pieces of hardware 500. In addition, in the computer 400, the middleware 502 or the application program 503 is loaded on the RAM 407 and executed by the CPU 401.

If a compression function is called by the CPU 401, a process based on at least part of the middleware 502 or the application program 503 is executed, thereby (controlling the pieces of hardware 500 in accordance with the OS 501 and) implementing the functions of the compression unit 40 and the file search unit 50. The compression functions may be included in the application program 503 itself or may be a portion of the middleware 502, which is called and executed in accordance with the application program 503.

The compressed file 2 acquired by the compression function of the application program 503 (or the middleware 502) can also be partially expanded. Expanding a portion at a midpoint of the compressed file 2 prevents the expansion process of the compressed data until the expanded portion, thereby reducing the load on the CPU 401. The compressed data to be expanded is partially loaded on the RAM 407, thereby reducing the working area.

Figure 14:
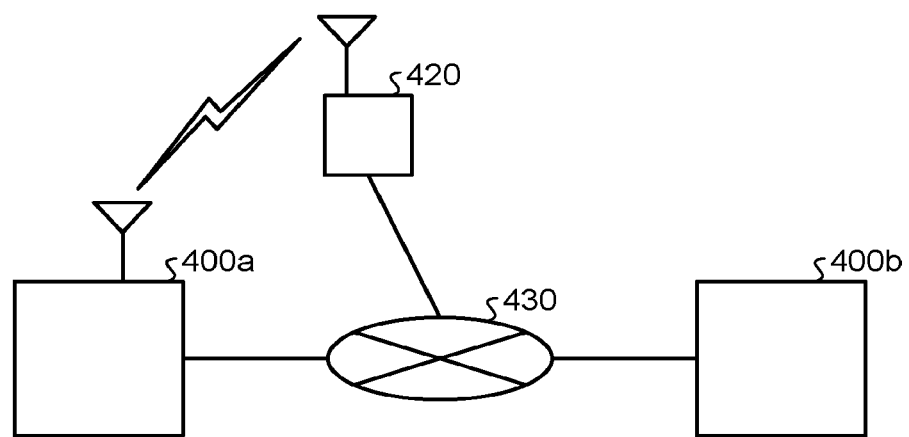
FIG. 14 is a diagram illustrating a configuration example of devices in a system according to an embodiment.

FIG. 14 is a diagram illustrating a configuration example of devices in a system according to an embodiment. The system in FIG. 14 includes a computer 400a, a computer 400b, a base station 420, and a network 430. The computer 400a is coupled to the network 430 coupled to the computer 400b through at least one of wireless or wired connection.

According to an embodiment of the present invention, strings in different date and time notation formats can be found all together without making any change on text data of a search subject.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
searching input text data for a date-time notation string that represents at least a date or time;
generating, upon finding the date-time notation string, a converted date and time code including an identification code for identifying the date-time notation string and a normalized date-time notation formed by converting the date-time notation string into a specific date-time notation format; and
converting the input text data based on conversion information that associates the converted date-time code with the date-time notation string.

2. The non-transitory computer-readable recording medium according to claim 1, wherein the normalized date and time notation is an absolute date and time notation that represents the date or the time in a uniquely identifiable sense.

3. The non-transitory computer-readable recording medium according to claim 1, wherein the normalized date and time notation is a relative date and time notation that represents the date or the time relative to a reference date or reference time.

4. The non-transitory computer-readable recording medium according to claim 1, wherein the generating generates a converted date and time code including a code corresponding to the normalized date and time notation, the code being given chronological order.

5. The non-transitory computer-readable recording medium according to claim 1, the process further comprising:
dynamically allocating a compressed code to a date-time notation string that has appeared in the input text data, and registering, in a dictionary, the compressed code of the date-time notation string in association with the normalized date and time notation of the date-time notation string, wherein the converting outputs the compressed code after converting the date-time notation string in the input text data into the compressed code of the date-time notation string registered in the dictionary.

6. An encoding method comprising:

searching input text data for a date-time notation string that represents at least a date or time;

generating, upon finding the date-time notation string, a converted date and time code including an identification code for identifying the date-time notation string and a normalized date and time notation formed by converting the date-time notation string into a specific date-time notation format; and converting the input text data based on conversion information that associates the converted date and time code with the date-time notation string.

7. An encoding device comprising:

a search unit that searches input text data for a date-time notation string that represents at least a date or time;

a generation unit that generates, upon finding the date-time notation string by the search unit, a converted date and time code including an identification code for identifying the date-time notation string and a normalized date and time notation formed by converting the date-time notation string into a specific date-time notation format; and an convert unit that converts the input text data based on conversion information that associates the converted date-time code generated by the generation unit with the date-time notation string.

* * * * *